United States Patent [19]

Olds

[11] Patent Number: 4,644,297
[45] Date of Patent: Feb. 17, 1987

[54] FREQUENCY LOCKED LOOP FOR THE TEMPERATURE COMPENSATION OF PHASE CODED SURFACE ACOUSTIC WAVE DEVICES

[75] Inventor: Keith A. Olds, Mesa, Ariz.

[73] Assignee: Motorola, Inc., Schaumburg, Ill.

[21] Appl. No.: 835,682

[22] Filed: Mar. 3, 1986

[51] Int. Cl.[4] .......................... H03H 9/145; H03L 7/08
[52] U.S. Cl. ....................................... 331/17; 310/315; 331/25; 331/176; 333/155
[58] Field of Search ...................... 331/107 A, 1 R, 25, 331/176, 17; 310/315; 333/155

[56] References Cited

U.S. PATENT DOCUMENTS

| 3,875,517 | 4/1975 | Dilley | 328/155 |
| 3,962,652 | 6/1976 | Zarin et al. | 331/1 R |
| 3,992,679 | 11/1976 | Isono | 331/1 R |
| 4,193,095 | 3/1980 | Mizushima | 358/241 |
| 4,245,196 | 1/1981 | Peebles, Jr. et al. | 331/178 |
| 4,489,289 | 12/1984 | Slobodnik et al. | 331/107 A |

FOREIGN PATENT DOCUMENTS 55-154805  12/1980  Japan ............................. 331/107 A

OTHER PUBLICATIONS

Carr et al., "The Effect of Temperature and Doppler Shift on the Performance of Elastic Surface Wave Encoders and Decoders", IEEE Transactions on Sonics and Ultrasonics, vol. SU-19, No. 3, Jul. 1972, pp. 357-367.

Holland et al., "Practical Surface Acoustic Wave Devices", Proceedings of the IEEE, vol. 62, No. 5, May 1974, pp. 582-611.

*Primary Examiner*—Siegfried H. Grimm
*Attorney, Agent, or Firm*—Raymond J. Warren

[57] ABSTRACT

A frequency locked loop having a surface acoustic wave time delay device disposed on the same substrate, or a substrate on the same material, as a surface acoustic wave device being compensated. As temperature causes changes in the surface acoustic wave device, changes in the time delay of the surface acoustic wave time delay device will also occur. These changes in the time delay are used by the frequency locked loop to adjust the frequency of an incoming signal of the frequency locked loop and to provide an adjusted input signal frequency to the surface acoustic wave device. This adjusted input compensates for the change in the output caused by the temperature change.

5 Claims, 4 Drawing Figures

FREQUENCY LOCKED LOOP

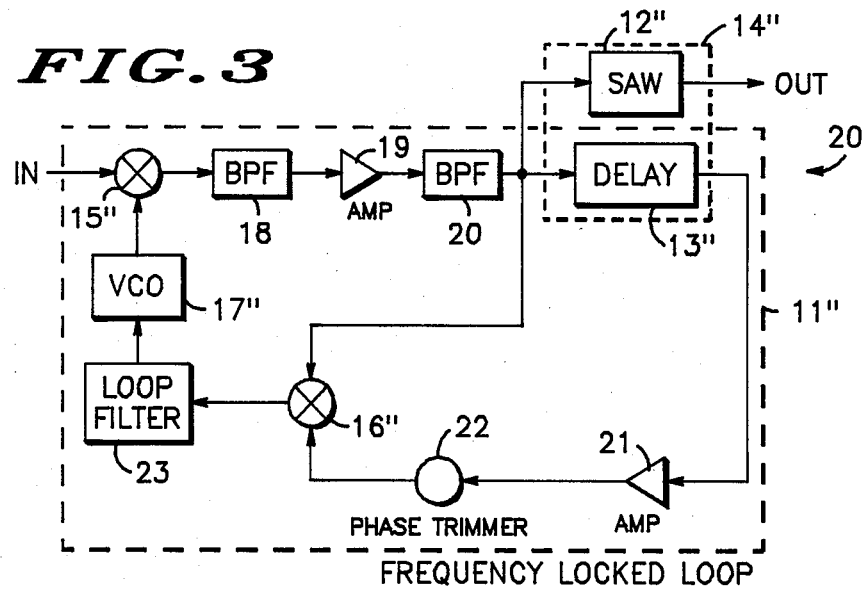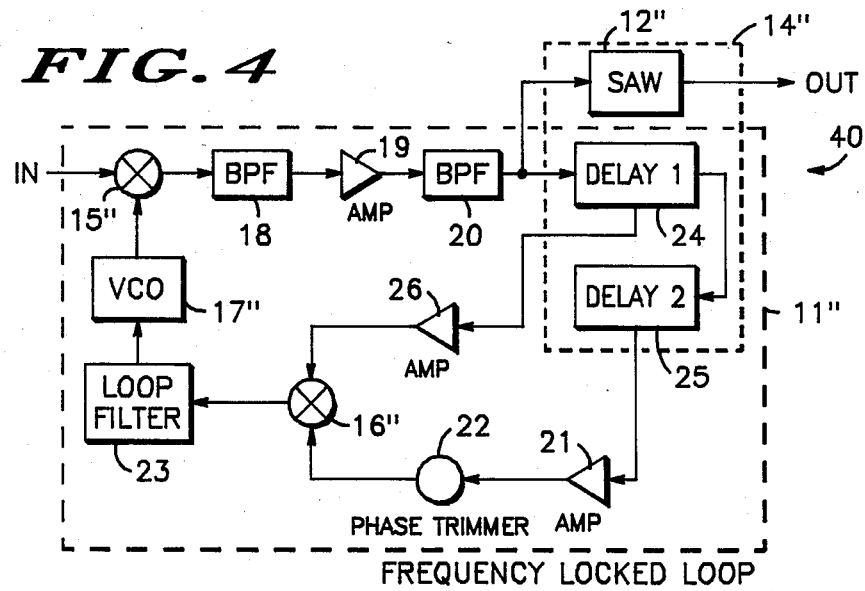

4,644,297

FREQUENCY LOCKED LOOP FOR THE TEMPERATURE COMPENSATION OF PHASE CODED SURFACE ACOUSTIC WAVE DEVICES

BACKGROUND OF THE INVENTION

The present invention relates, in general, to a method and apparatus for temperature compensation and, more particularly, to temperature compensation phase coded surface acoustic wave devices.

Many devices are known in the art for performing temperature compensation. An example of this can be found in "Tracking Phase Detector For Surface Wave Devices" (U.S. Pat. No. 3,875,517) issued to Douglas M. Dilley. The Dilley reference compensates for change in a surface acoustic wave (SAW) device by tracking the drop outs of the signal as shown in FIG. 1. These drop cuts are generally not acceptable in present day applications, since they represent a loss of power caused by reflections in the SAW device. See, Holland & Clairborne, Practical Surface Acoustic Wave Devices, Vol. 62 Proceedings of the I.E.E.E. No. 5 (May 1974).

SUMMARY OF THE INVENTION

Accordingly, it is an object of the present invention to provide a method and apparatus for the temperature compensation of phase coded surface acoustic wave devices that overcome the above deficiencies.

A further object of the present invention is to provide a method and apparatus for the temperature compensation of phase coded surface acoustic wave devices which is more efficient.

Another object of the present invention is to provide a method and apparatus for the temperature compensation of phase coded surface acoustic wave devices that requires less circuitry.

Still another object of the present invention is to provide a method and apparatus for the temperature compensation of phase coded surface acoustic wave devices that is more economical.

Yet another object of the present invention is to provide a method and apparatus for the temperature compensation of phase coded surface acoustic wave devices that is operable over a wider range of SAW devices.

The above and other objects and advantages of the present invention are provided by a self compensating frequency locked loop.

A particular embodiment of the present invention consists of a frequency locked loop having a delay contained on the same or similar substrate as the SAW device.

BRIEF DESCRIPTION OF THE DRAWINGS

FIG. 3 is a more detailed block diagram of the temperature compensating circuit illustrated in FIG. 2; and FIG. 4 is a block diagram of a second embodiment of a temperature compensating circuit embodying the present invention.

DETAILED DESCRIPTION OF THE DRAWINGS

Figure 1:
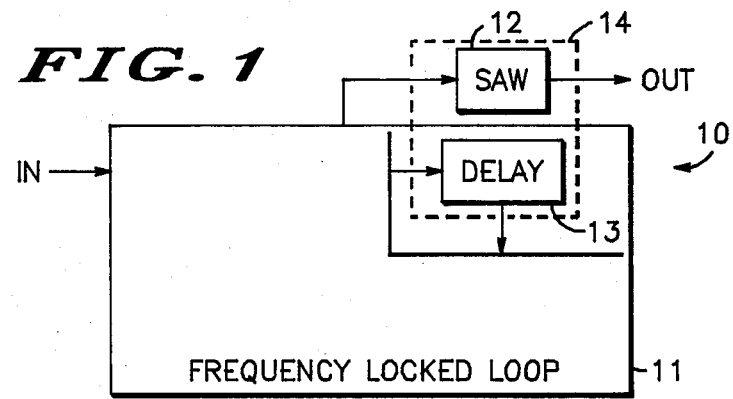
FIG. 1 is a block diagram of a temperature compensating circuit embodying the present invention.

Referring now the block diagram of FIG. 1, a temperature compensating circuit, generally designated 10, embodying the present invention is illustrated. Circuit 10 consists of a frequency locked loop (FLL) 11 and a SAW device 12. SAW 12 is a phase coded SAW device such as a band pass filter, a biphase correlator, a chirp (linear FM) correlator, or the like. FLL 11 contains a delay 13 having a time delay t. Delay 13 and SAW 12 are designed to be on the same substrate 14, or a substrate of the same material.

Changes in the environment (i.e. temperature) can cause the physical geometry of SAW device 12 to vary. This will cause the central frequency of SAW 12 device to shift. For example, if SAW 12 were taken as a correlator, an increase in temperature would generally cause the device to expand. This would cause the lines in the correlator to be spaced further apart thereby causing a drop in the center frequency. By placing delay 13 on the same substrate as SAW 12, the same temperature increase would cause an increase in the delay time, t, of delay 13. This increase in the delay time, t, is used to offset the change in frequency of SAW device 12. This will be shown in more detail below.

Figure 2:
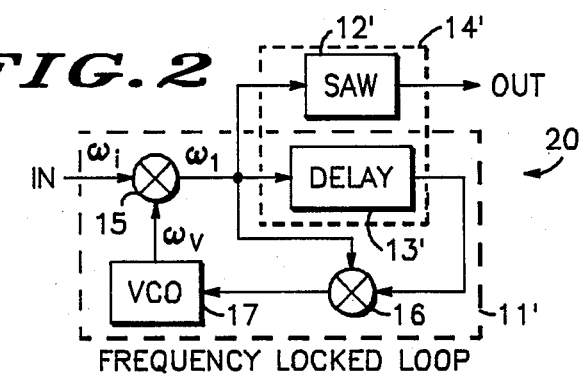
FIG. 2 is a more detailed block diagram of the temperature compensating circuit illustrated in FIG. 1.

Referring now to the block diagram of FIG. 2, a more detailed circuit, generally designated 20, is illustrated embodying the present invention. Circuit 20 has elements that are identical to FIG. 1. These elements have been labeled with the same numbers and are distinguished by the addition of a single prime ('). Circuit 20 consists of FLL 11' having, in addition to delay 13', a mixer 15, a phase detector (e.g. a mixer) 16, and a voltage controlled oscillator (VCO) 17.

An input is received by FLL 11' at a first port of mixer 15. The second port of mixer 15 receives an input from the output of VCO 17. Mixer 15 produces an IF (intermediate frequency) output which is provided to SAW 12', delay 13' and a first input of phase detector 16. The second input of phase detector 16 is coupled to the output of delay 13'. The output of phase detector 16 is a signal indicative of the difference in phase between the two input signals. The output signal from phase detector 16 is sent to VCO 17 which determines the output frequency of VCO 17. FLL 11' essentially sets the frequency of VCO 17 such that the output of phase detector 16 is driven to zero, or very close.

Designating the IF frequency $w_1$, the input to phase detector 16 and delay 13' from mixer 15 is $\cos(w_1 T)$. The signal output from delay 13' to phase detector 16 is defined as $\cos(w_1[T-t])$ where: T is time and t is the delay time in delay 13'. The output, $V_o$, from phase detector 16 is then, $$V_o = \cos(w_1 T)\cos[w_1(T-t)]. \tag{1}$$

Reducing equation (1) and ignoring the second order component, gives:

$$V_o = (\tfrac{1}{2})\cos(w_1 t). \tag{2}$$

In order to drive this output to zero, $\cos(w_1 t)$ must equal zero or, $w_1 t$ must equal $\pm n(\pi/2)$, where n is an integer. This means that when the delay, t, is defined by, $$t = \pm n(\pi/2w_1), \tag{3}$$

the output form phse detector 16 will be zero and FLL 11' will be locked on the frequency.

From equation (3) it can be seen that if t increases (decreases) from environmental effects when the required $w_1$ will decrease (increase). The change in $w_1$ is caused in mixer 15 where the input of FLL 11' is designated as $w_i$ and the input from VCO 17 is $w_v$. The result is, $$w_1 = w_i - w_v. \quad (4)$$

When the difference in the phases does not meet the requirements of equation (3) then phase detector 16 produces an output signal. The level of this output signal determines the output frequency of the signal, $w_v$, from VCO 17. If the inputs to phase detector 16 are equal, then the output from VCO 17 is not changed.

Environmental changes (i.e. temperature) can cause physical changes in the circuit which will result in t increasing (decreasing) and the center frequency of the frequency response of the output from SAW 12' decreasing (increasing). This decrease (increase) in t will result in the output from phase detector 16 increasing (decreasing); and the output, $w_v$, from VCO 17 will then decrease (increase) while $w_i$ remains the same. This will cause an offsetting increase (decrease) in $w_1$ which will compensate for the change in the output of SAW 12'. This will be explained in more detail below.

Referring now to the diagram of FIG. 3, a temperature compensating circuit, generally designated 30, embodying the present invention is illustrated. Circuit 30 has been included to show a more practical implementation of the temperature compensating device. Circuit 30 comprises many of the same elements as FIGS. 1 and 2. These same elements have been given the same numbers and identified with the use of double quotes (").

The input of FLL 11" is received by mixer 15" where it is combined with the output from VCO 17". The output from mixer 15" is transmitted to a band pass filter (BPF) 18. BPF 18 is provided to remove spurious signals that will be generated by mixer 15". The output of BPF 18 is then transmitted to an amplifier 19. Amplifier 19 is provided to compensate for losses caused in processing the signal. The output of amplifier 19 is transmitted to BPF 20 for elimination of spurious signals that may be more prevalent after amplification. The output of BPF 20 is then transmitted to SAW 12", delay 13" and phase detector 16".

The output from delay 13" is transmitted to an amplifier 21. Amplifier 21 serves to compensate for the losses inherent in processing a signal acoustically, such as is done in delay 13". The output from amplifier 21 is then transmitted to phase trimmer (PT) 22. Phase trimmer 22 is provided to allow precision compensation for production tolerances in delay 13". The outputs of BPF 20 and phase trimmer 22 are then combined in phase detector 16". The output of phase detector 16" is then transmitted to a loop filter (LF) 23 that sets the loop response for a particular application. The output from loop filter 23 is then transmitted to VCO 17".

The compensation caused by delay 13" can be shown by the following theoretical explanation. The output of phase detector 16', $V_o$, is shown in equation (3). Taking the differential of $V_o$ to linearize this around the nominal operating conditions $w_o$ and t gives:

$$dV_o = (\tfrac{1}{2}) \cos(w_o t_D)(t_D dw + w_o dt) \quad (5)$$

where:
$w_o$ is the nominal center frequency; and
$t_D$ is the nominal delay time of delay 13". Using the Laplace transform, the loop response of FLL 11" to a change in delay 13" results in the following closed loop transfer function:

$$\frac{\Delta w_o}{\Delta t_D} = \frac{-k_v F(s) w_o}{1 + k_v F(s) t_D e^{-st}} \quad (6)$$

where:
$k_v$ is the DC gain constant of FLL 11";
F(s) is the loop filter, 23, transfer function;
s is the Laplace variable: and
e is the base of the natural log.

Taking a specific case, the transfer function for the first order loop filter can be written as:

$$F(s) = \frac{K_f}{1 + t_p s} \quad (7)$$

where:
$K_f$ is the DC gain of loop filter 23; and
$t_p$ is the time constant of loop filter 23.
By substituting equation (7) into equation (6) and reducing the following equation is reached:

$$H(s) = \frac{-K_1 e^{st} w_o}{1 + K_1 e^{-st} t_D + t_p s} \quad (8)$$

where: $K_1 = K_v K_f$
Modeling the delay change as a step function $\Delta t$ the Laplace transform of this input is $\Delta t/s$. This results in $$\Delta W(s) 32\ H(s)(\Delta t/s) \quad (9)$$

By applying the final value theorem:

$$\lim_{t \to \infty} \Delta W(t) = \lim_{s \to 0} H(s) \Delta t \quad (10)$$

equation (8) becomes:

$$\lim_{s \to 0} H(s) = \frac{-K_1 w_o}{1 + K_1 t_p} \quad (11)$$

which for $K_1 \gg 1$ is:

$$\frac{\Delta w_o(\infty)}{\Delta t_p(\infty)} = \frac{-w_o}{t_p} \quad (12)$$

This represents the response of FLL 11".

The fractional shift of the center frequency of SAW 12" due to a temperature change can be represented by:

$$\frac{\Delta w}{W} = -T_t \Delta T = -\frac{\Delta t}{t_p} \quad (13)$$

or, $$\frac{\Delta w}{\Delta t} = -\frac{w_o}{t_p} \quad (14)$$

where:
$T_t$ is the temperature coefficient of the SAW substrate material 14"; and
$\Delta T$ is the change in temperature.

These equations concerning SAW 12" can be found in Carr et al., "The Effect of Temperature and Doppler Shift on the Performance of Elastic Surface Wave Encoders and Decoders," SU-19 IEEE Transactions on Sonics and Ultrasonics #3 (July 1972). This shows that the loop response for FFL 11" is the same magnitude as the SAW response set out in equation (12). By properly choosing the sign of the loop response during the circuit design, the frequency shift of FLL 11", due to change in delay 13", tracks the center frequency shift of SAW 12" and compensation results.

Referring now to the diagram of FIG. 4, a temperature compensating circuit, generally designated 40, embodying the present invention is illustrated. FIG. 4 is the same circuit as described in FIG. 3 except for a change in time delay 13", FIG. 3. In FIG. 4 the time delay is represented by two separate time delays 24 and 25 located on the same substrate. Two delays 25 and 25 are used to provide a more balanced response making the circuit easier to build and implement. An amplifier 26 has also been added to circuit 30 in circuit 40 to compensate for power loss in processing the signal through delay 24.

Defining the input to delays 24 and 25 as cos ($w_1T$) the output from delay 24 becomes:

$$\cos(w_1[T-t_1]) \quad (15)$$

and the output from delay 25 becmes:

$$\cos(w_1[T-t_2]). \quad (16)$$

When processed through phase detector 16" the output becomes:

$$\cos(w_1[t_2-t_1]). \quad (17)$$

For the output of phase detector 16" to be zero equation (17) must be equal to zero, or:

$$w_1[t_2-t_1] = \pm n(\pi/2) \quad (18)$$

or, $$w_1 = +n(\pi/2[t_2-t_1]). \quad (19)$$

This provides the same result as described with respect to FIG. 2 above. As the temperature increases (decreases), the time delays, $t_1$ and $t_2$ will increase (decrease). This will cause the output of phase detector 16" to change resulting in a change in the output of VCO 17". The change in the output of VCO 17" will cause a corresponding change in the input to mixer 15" which will increase (decrease) the frequency, $w_1$ of the output signal from mixer 15". This will compensate for the change in the output of SAW 12" caused by the temperature increase (decrease).

Thus, it is apparent to one skilled in the art that there has been provided in accordance with the invention, a device and method that fully satisfies the objects, aims and advantages set forth above.

It has been shown that the present invention provides a temperature compensator for phase coded surface acoustic wave devices that is more efficient; requires less circuitry; is more economical; and is self compensating.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

What is claimed is:

1. A temperature compensating circuit having an input and an output, for phase coded surface acoustic wave devices said circuit comprising:
   a phase coded surface acoustic wave device being defined on a first substrate, said phase coded surface acoustic wave device having an input and an output coupled to said output of said circuit; and
   frequency locked loop means having an input coupled to said input of said circuit, and an output coupled to said input of said phase coded surface acoustic wave device, and a first time delay surface acoustic wave device having an input and an output and being defined on said first substrate and connected in circuit for maintaining a constant frequency output from said temperature compensating circuit relative to signals applied to the input of said temperature compensating circuit.

2. The temperature compensating circuit of claim 1 wherein said frequency locked loop means comprises:
   a mixer having a first input, a second input coupled to said input of said circuit and an output being coupled to said inputs of said phase coded surface acoustic wave device and said first time delay device;
   a phase detector having a first input being coupled to said output of said mixer, a second input being coupled to said output of said first time delay device, and an output; and
   a voltage controlled oscillator having an input coupled to said output of said phase detector and an output coupled to said first input of said mixer.

3. The temperature compensating circuit of claim 1 wherein said frequency locked loop means comprises:
   a mixer having a first input, a second input being coupled to said input of said circuit, and an output;
   a first bandpass filter having an input coupled to said output of said mixer, and an output;
   a first amplifier having an input coupled to said output of said first bandpass filter and an output;
   a second bandpass filter having an input coupled to said output of said first amplifier and an output coupled to said inputs of said phase coded surface acoustic wave device and said time delay device;
   a second amplifier having an input coupled to said output of said first time delay device and an output;
   a phase trimmer having an input coupled to said output of said second amplifier and an output;
   a phase detector having a first input coupled to said output of said second bandpass filter, a second input coupled to said output of said phase trimmer, and an output;
   a loop filter having an input coupled to said output of said phase detector and an output; and
   a voltage controlled oscillator having an input coupled to said output of said loop filter and an output being coupled to said first input of said mixer.

4. The temperature compensating circuit of claim 1 wherein said frequency locked loop means comprises:
   a mixer having a first input, a second input being coupled to said input of said circuit, and an output;
   a first bandpass filter having an input coupled to said output of said mixer, and an output;

a first amplifier having an input coupled to said output of said first bandpass filter and an output;

a second bandpass filter having an input coupled to said output of said first amplifier and an output coupled to said input of said phase coded surface acoustic wave device;

a second time delay device being disposed on said first substrate and having an input coupled to said output of said second bandpass filter, a first output coupled to said input of said first time delay device and a second output;

a second amplifier having an input coupled to said second output of said second time delay device and an output;

a third amplifier having an input coupled to said output of said first time delay device and an output;

a phase trimmer having an input coupled to said output of said third amplifier and an output;

a phase detector having a first input coupled to said output of said second amplifier, a second input coupled to said output of said phase trimmer, and an output;

a loop filter having an input coupled to said output of said phase detector and an output; and a voltage controlled oscillator having an input coupled to said output of said loop filter and an output being coupled to said first input of said mixer.

5. A temperature compensating circuit for phase coded surface acoustic wave devices having an input and an output, said circuit comprising:

a phase coded surface acoustic wave device being defined on a first substrate, said phase coded surface acoustic wave device having an input and an output coupled to said output of said circuit;

a mixer having a first input, a second input being coupled to said input of said circuit, and an output;

a first bandpass filter having an input coupled to said output of said mixer and an output;

a first amplifier having an input coupled to said output of said first bandpass filter and an output;

a second bandpass filter having an input coupled to said output of said first amplifier and an output coupled to said input of said phase coded surface acoustic wave device;

a first time delay device being disposed on said first substrate and having an input coupled to said output of said second bandpass filter, a first output and a second output;

a second time delay device being disposed on said first substrate and having an input coupled to said first output of said first time delay device and an output;

a second amplifier having an input coupled to said second output of said first time delay device and an output;

a third amplifier having an input coupled to said output of said second time delay device and an output;

a phase trimmer having an input coupled to said output of said third amplifier and an output;

a phase detector having a first input coupled to said output of said second amplifier, a second input coupled to said output of said phase trimmer, and an output;

a loop filter having an input coupled to said output of said phase detector and an output; and a voltage controlled oscillator having an input coupled to said output of said loop filter and an output being coupled to said first input of said mixer.

* * * * *